US007505284B2

(12) United States Patent
Offrein et al.

(10) Patent No.: US 7,505,284 B2
(45) Date of Patent: Mar. 17, 2009

(54) SYSTEM FOR ASSEMBLING ELECTRONIC COMPONENTS OF AN ELECTRONIC SYSTEM

(75) Inventors: Bert J. Offrein, Schoenenberg (CH); Stefano S. Oggioni, Milan (IT); Mauro Spreafico, Sesto San Giovanni (IT)

(73) Assignee: International Business Machines Corporation, Armonk, NY (US)

( * ) Notice: Subject to any disclaimer, the term of this patent is extended or adjusted under 35 U.S.C. 154(b) by 122 days.

(21) Appl. No.: 11/416,757

(22) Filed: May 3, 2006

(65) Prior Publication Data
US 2006/0267176 A1 Nov. 30, 2006

(30) Foreign Application Priority Data
May 12, 2005 (EP) ................................. 05300372

(51) Int. Cl.
*H05K 1/11* (2006.01)
(52) U.S. Cl. ...................... 361/784; 361/791
(58) Field of Classification Search .............. 361/784, 361/670; 257/680

See application file for complete search history.

(56) References Cited

U.S. PATENT DOCUMENTS

| 5,825,628 | A  | * | 10/1998 | Garbelli et al. | ............. | 361/763 |
| 6,787,919 | B2 | * | 9/2004 | Su | ............................. | 257/778 |
| 2006/0072871 | A1 | * | 4/2006 | Uchida | ........................ | 385/14 |

* cited by examiner

*Primary Examiner*—Tuan Dinh
*Assistant Examiner*—Abiy Getachew
(74) *Attorney, Agent, or Firm*—Lynn L. Augspurger

(57) ABSTRACT

An electronic system comprising: an electronic system support substrate for the attachment of components of the electronic system, the electronic system support substrate including electric signal propagation paths for the propagation of electric signals between the system components; at least a first and a second electronic components wherein at least the first electronic component is part of a module in mechanical and electrical connection with the electronic system support substrate, the module comprising a module substrate to which the first electronic component is at least mechanically connected, and an electric coupling between the first and the second electronic components, for the electric coupling allowing the first and the second electronic components exchange of electric signals. The electric coupling comprises a direct electric connection particularly formed by a flexible electrical interconnection member, between the first and the second electronic components, the electric connection being independent of the electronic system support substrate.

14 Claims, 3 Drawing Sheets

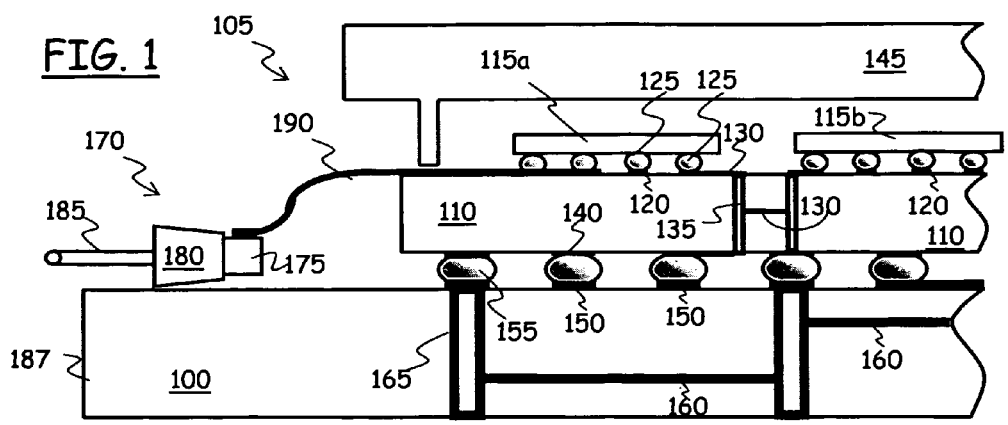
FIG. 1
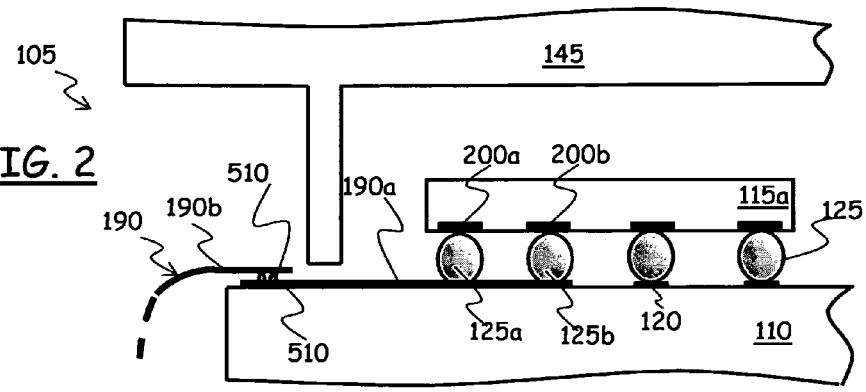
FIG. 2
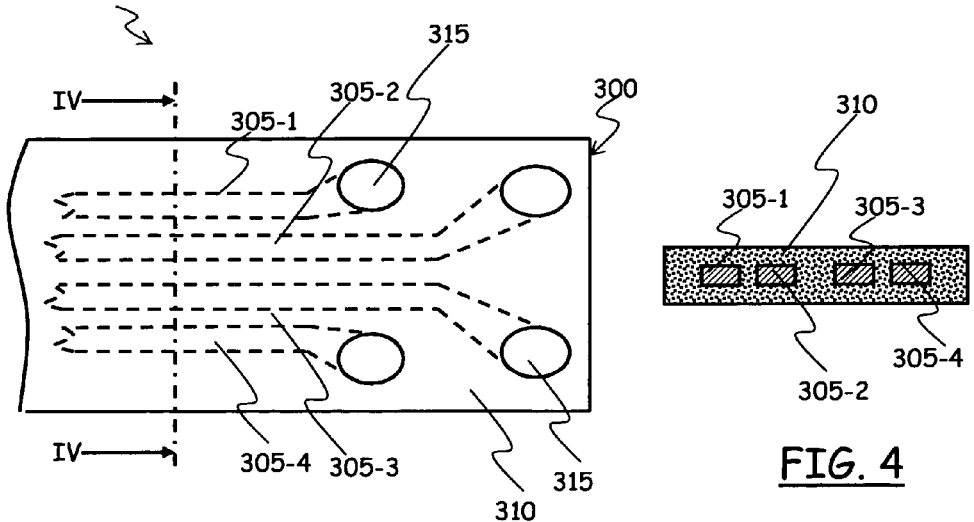
FIG. 3
FIG. 4

SYSTEM FOR ASSEMBLING ELECTRONIC COMPONENTS OF AN ELECTRONIC SYSTEM

TECHNICAL FIELD

The present invention relates to the field of electronic circuits and systems, particularly albeit not limitatively to systems including both electronic and optical components (hereinafter shortly referred to as opto-electronic systems). Specifically, the present invention relates to the aspects of packaging, assembling and functionally interconnecting the different systems' components.

BACKGROUND ART

Components of electronic or opto-electronic systems, such as for example Integrated Circuits (ICs) like data and/or signal processors (microprocessors, CPUs, DSPs, ASICs), photodetectors, semiconductor lasers, are usually packaged in respective packages, and then assembled to boards (Printed Circuit Boards—PCBs) that perform a double function of providing a mechanical support as well as a functional (electrical) interconnection between the different systems' components.

One packaging solution known in the art, featuring a high packing efficiency, is the so-called Multi-Chip-Module (MCM) packaging: in an MCM package, two or more IC chips (dies) are directly attached, typically soldered (for example, using so-called C4—Controlled Collapse Chip Connections—technique) to a common substrate, the MCM substrate, e.g. of organic material; the MCM package, rather than the individual IC chips, is then assembled to the PCB.

Electronic components' packages has the primary function of protecting the packaged components mechanically and from attacks by agents in the external environment.

However, in applications involving high operating speeds, which are becoming more and more common, a further requirement of the packages is that they essentially maintain the performance levels of the electronic components they carry within, or that they affect the packaged components' performances as less as possible. An example of high-speed application where the characteristics of components' packages are critical are opto-electronic systems, wherein high switching speed electrical signals often have to be converted into optical signals, and vice versa.

In particular, when the signals' switching speed exceeds the Gigahertz, a proper analysis of the electronic system needs to take into account the wave nature of the electromagnetic field: the transmission of an electric signal (e.g., a voltage) needs to be considered from the viewpoint of an electromagnetic wave that propagates through the circuit, being supported by an electric current in a circuit's conductive trace.

The solutions adopted for packaging the electronic components of a high-speed system affect the propagation of the electromagnetic wave.

An important role is played by the properties of the packages' materials: it is for example known that the materials' dielectric constants and dielectric losses affect the electromagnetic wave propagation. Another aspect that impacts the performance of the packaged components is the package structure (such as its spatial configuration).

As a result, a package, if not carefully designed and selected, may have such an impact on the packaged component's performance (e.g., the package may affect the propagation of electromagnetic waves corresponding to the signals generated or received by the packaged component to such an extent) that the packaged component becomes almost inoperable, at the expected operating speed.

For example, considering the case of an opto-electronic system, light-emitting devices (e.g., laser diodes) used to convert electrical signals into optical signals need to receive electrical signals already modulated at high speed, generated for example by a microprocessor: a bad electrical signal transmission from the signal generator to the electro-optical converter translates into a bad optically converted signal. Similar considerations apply to the reverse signal conversion, from optical into electrical: the high-speed electrical signals generated by, e.g., a photodetector, like a photodiode, must not be worsened too much in the propagation from the photodetector to the IC(s) that have to process the converted electrical signals.

Packages for components of electronic systems thus need to be designed in such a way that they do not affect, as far as possible, the propagation of electromagnetic waves associated with the electric signals generated/received by the packaged ICs.

To this purpose, a known countermeasure calls for designing and realizing circuit structures having a carefully controlled impedance value across a generic signal transmission line.

Controlling the transmission line impedance value is however not sufficient, due to the unavoidable presence of parasitic elements exhibiting a capacitive, resistive or inductive behavior, which parasitic elements are intrinsically embedded in the package, or in the PCBs, due to the association of materials and conductive structures needed to establish paths for electrical currents.

A careful selection of materials with physical properties favorable to the electromagnetic wave propagation, such as for example PTFE (PolyTetraFluoroEthylene), is not sufficient to compensate and overcome all the other effects, inherent to the package structure, e.g. the spatial configuration of MCM structures.

In particular, the propagation of electromagnetic waves is severely affected by any kind of physical discontinuity along the wave propagation path; by physical discontinuity there is intended any more or less abrupt change or transition in properties such as structure, material properties, design features.

For example, let the case be considered of an electronic system wherein electric signals for driving an electro-optical component, like a laser diode, particularly a VCSEL (Vertical Cavity Surface Emitting Laser), are generated by an IC, e.g. a CPU, which is packaged in an MCM package, and assembled to a PCB to which the VCSEL is also mounted. Several discontinuities can be observed in the signal path from the signals generator IC to the laser diode, namely the transitions from the IC signal line to the corresponding IC pad, from the IC pad to the (e.g., C4) solder bump, from the solder bump to the corresponding (e.g., C4) contact pad on the MCM's substrate, then to the conductor signal line on the MCM's substrate, from the MCM's conductor signal line to the MCM's bondage pad (e.g., a Ball Grid Array—BGA—pad) used for bonding the MCM substrate to the PCB (this transition may in particular be made up of several different transitions, corresponding for example to one or more laser vias and PTHs—Pin Through Holes), from the MCM's bondage pad to the (e.g., BGA) solder bump and to the corresponding (e.g., BGA) contact area on the PCB, then to the signal line trace on the PCB up to the laser diode. Some of the above transitions have an inherent impedance mismatch.

Experiments have demonstrated that the transition corresponding to the BGA-type bondage of the MCM substrate to the PCB has the biggest impact at high operating frequencies, having an essentially capacitive effect, and thus acting as a low-pass filter that significantly reduces the transmission line bandwidth. A lower importance, but not negligible role is played by plated through-holes in the MCM's substrate or in the PCB, C4 pads for bonding the IC chips to the MCM's substrate, laser vias and coupling effects between the signal lines and voltage supply planes.

SUMMARY OF THE INVENTION

The Applicant has faced the problem of how to reduce to impact of signals' propagation in electronic or opto-electronic systems on the signals' properties.

The Applicant has devised a new solution for assembling and, particularly, functionally connecting to each other components of an electronic system, that allows to substantially reduce the number of discontinuities along a signal propagation path; thus, thanks to the solution devised by the Applicant, the propagation of the signals slightly affects the signals' characteristics.

According to an aspect of the present invention, an electronic system is provided, as set forth in appended claim 1, comprising:

an electronic system support substrate for the attachment of components of the electronic system, said electronic system support substrate including electric signal propagation paths for the propagation of electric signals between the system components;

at least a first and a second electronic components, wherein at least the first electronic component is part of a module in mechanical and electrical connection with the electronic system support substrate, said module comprising a module substrate to which the first electronic component is at least mechanically connected, and an electric coupling between the first and the second electronic components, for the electric coupling allowing the first and the second electronic components exchange of electric signals, said electric coupling comprises a direct electric connection between the first and the second electronic components, said electric connection being independent of the electronic system support substrate.

In particular, said electric connection includes a flexible electrical interconnection member having a first end electrically connected to the first electronic component, and a second end electrically connected to the second electronic component.

According to a second aspect of the present invention, a method is provided for, for assembling an electronic system, comprising:

providing an electronic system support substrate for the attachment of components of the electronic system and including electrical signal propagation paths for the propagation of electrical signals between the system components at least;

providing a first and a second electronic component, wherein at least the first electronic component is attached to a module comprising a module substrate to which the first electronic component is at least mechanically connected, assembling the first and second electronic components to the electronic system support substrate, said assembling including establishing an electric coupling between the first and the second electronic component for the exchange of electric signals, said establishing an electric coupling comprises providing a direct electric connection between the first and the second electronic components, said electric connection being independent of the electronic system support substrate.

In particular, said providing said electric connection includes a providing flexible electrical interconnection member having a first end and a second end, and electrically connecting the first end to the first electronic component, and the second end to the second electronic component.

BRIEF DESCRIPTION OF THE DRAWINGS

The features and advantages of the present invention will be made apparent by the following detailed description of some embodiments thereof, provided merely by way of non-limitative examples, description that will be conducted making reference to the attached drawings, wherein:

FIG. 1 schematically depicts a small portion of a PCB of an electronic system with, mounted thereto, an MCM package carrying an IC electrically connected to an electro-optical conversion component by means of a flexible electrical interconnection member, according to an embodiment of the present invention;

FIG. 2 shows a detail of the flexible electrical interconnection member of FIG. 1, in an alternative embodiment of the present invention;

FIGS. 3 and 4 schematically show, in top-plan and cross-sectional views, respectively, a terminal portion of a flexible electrical interconnection member, according to an embodiment of the present invention;

DETAILED DESCRIPTION OF THE PREFERRED EMBODIMENT(S)

Figure 5:
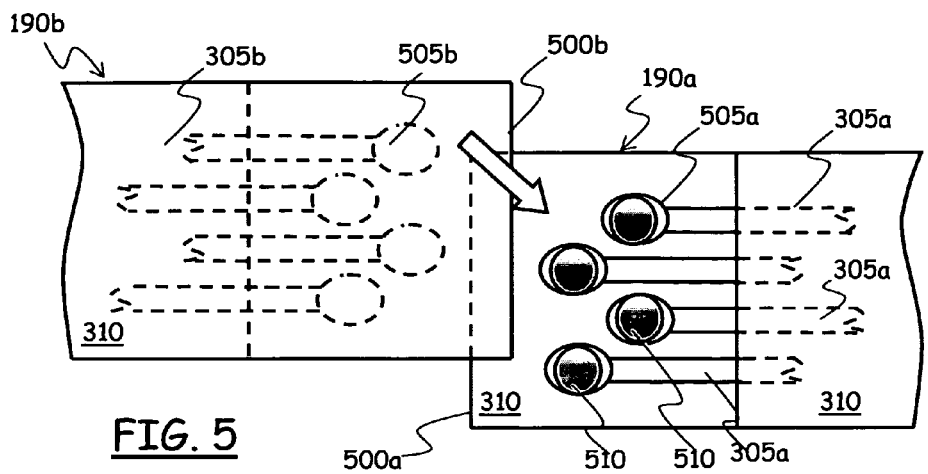
FIG. 5 schematically shows, in top-plan view, two ends of two spans of a flexible electrical interconnection member intended to be joined to each other, according to an embodiment of the present invention.

With reference to the drawings, in FIG. 1 there is shown, very schematically, a portion of a PCB 100 of an electronic system; for example, the electronic system may include several PCBs like the PCB 100, adapted to be connected to a backplane (not shown in the drawings) of a rack. The electronic system may for example be part of an optical communications system.

As visible in the drawing, an MCM package 105 is mounted to the PCB 100; schematically, the MCM package comprises an MCM substrate 110, made for example of a ceramic or organic (e.g., plastic) material. Two or more IC chips are mounted to the MCM substrate 110, like the two IC chips 115a and 115b shown in the drawing. The IC integrated in the chips mounted to the MCM substrate 110 can be of whatsoever type, their specific nature being not critical nor limitative to the present invention; in particular, the ICs can be standard or full-custom or ASIC chips, like for example a microprocessor IC (a CPU), a DSP IC, a memory IC, or the like.

The IC chips 115a and 115b are attached to the MCM substrate 110 by means of suitable mechanical and electrical connections. For example, IC contact pads (not visible in FIG. 1) are connected by means of generically ball-shaped solder bumps 125, made of a suitable solder alloy, to corresponding contact pads 120 on the upper surface of the MCM substrate 110, for example by means of C4 (Chip Controlled Collapse Connection) technique. Other bonding techniques are possible, for example thermosonic, ultrasonic or thermocompression wire-bonding (as will be discussed later in the present description) or mixed techniques, as well asbonding techniques that in place of ball-shaped solder bumps use vertically-extending elements like small pillars made of copper or different solder alloys, protruding, or being attached to the IC pads, thus establishing the interconnection mechanism.

In the MCM substrate 110, conductor lines 130 are formed of a conductor material, like for example: plated copper (typically used in organic rigid and/or flexible substrates, as well as in ceramic packages), molibdenum (typically used in thin-film ceramic packages), aluminum or copper (typically used in thin-film technologies) using a carrier of silicon, quartz, borosilicate glass, lead borosilicate, boron nitride, diamond; thick-film technologies typically uses silver, gold, copper, gold-platinum, silver-palladium, and palladium-gold. In particular, the conductor lines 130 may be formed only on the top and bottom surfaces of the MCM substrate 110, or the MCM substrate 110 can have a multi-layered structure, with one or more intermediate planes of conductor lines 130; vias 135 in the MCM substrate 110 allow electrically connecting conductor lines 130 located on the two opposite MCM surfaces and/or in the one or more intermediate planes. The conductor lines 130 may in particular be provided for operatively connecting to each other the different IC chips mounted to the MCM substrate 110, as well as for connecting (at least some of the contact pads of) the IC chips mounted to the MCM substrate to contact pads 140 provided on the MCM package, intended for connecting the MCM package to the PCB 100; in particular, according to an embodiment of the present invention, supply voltages and low switching frequency signals are transferred in this way from the PCB to the MCM, or vice versa.

A cap or an heat-sink 145 may be provided to cover the MCM substrate 110, protecting the IC chips of the MCM and also providing some level of sealing.

The MCM package 105 is attached to the PCB 100 by means of soldering techniques; in particular, and merely by way of example, the MCM pads 140 may be arranged according to a BGA arrangement, and they may be bonded to corresponding PCB contact pads 150 by means of BGA solder bumps 155, according to specific custom solution or to international industry standards like the JEDEC™ MS034 of the JEDEC Solid State Technology Association (formerly, Joint Electron Device Engineering Council). Alternative soldering techniques involve the usage of vertical structures such as columns or pillars made of soldering alloys or metals like copper, soldered or brazed to the module.

In the PCB 100, conductor traces 160 are formed of a conductor material; in particular, the conductor traces 160 may be formed only on the top and bottom surfaces of the PCB 100, or, more typically, the PCB 100 can have a multi-layered structure, with one or more intermediate planes of conductor traces 160; plated through holes 165 in the PCB 100 allow contacting non-coplanar conductor traces 160, that lie on different planes. The conductor traces 160 may in particular be provided for operatively connecting two or more MCM packages to each other, or to IC chips or other components mounted directly on the PCB.

Also schematically shown in the drawing is an electro-optical converter 170, adapted to convert an electrical signal, e.g. a voltage signal, into a corresponding optical signal, to be propagated for example through a waveguide, like an optical fiber 185. In particular, and merely by way of example, the electro-optical converter 170 comprises a VCSEL 175 and an associated Laser Diode Driver (LDD), optically coupled to a standard optical connector 180, for example for the connection of an optical fiber 185. The electro-optical converter 170 is arranged close to an edge 187 of the PCB 100 (a typical solution).

For the purposes of describing an exemplary embodiment of the present invention, in the following it will be assumed that one of the chips in the MCM package 105, for example the chip 115a, has integrated therein an IC intended to be operatively associated with, particularly driving the electro-optical converter 170; for example, the IC may be a processor, e.g. a CPU that generates electrical signals (characterized by a high switching speed, of 1 Ghz or more), e.g. voltage signals, which are to be fed to the electro-optical converter 170 for being converted into corresponding optical signals, to be then propagated through the optical fiber 185.

The signals to be fed to the electro-optical converter 170 are made available at respective contact pads of the IC chip 115a, for example (referring to the enlarged detail of FIG. 2) at the pads 200a and 200b of the IC chip 115a.

In order to reduce the signal path from the pads 200a and 200b to the electro-optical converter 170, the latter is preferably arranged as close as possible to the IC chip 115a.

In prior-art solutions, as discussed in the introductory part of the present description, the signal path from the IC chips pads 200a and 200b to the corresponding terminals of the electro-optical converter 170 would include several transitions, with associated physical discontinuities that would have a strong, negative impact on the propagation of the electromagnetic waves corresponding to the propagation of the high-speed signals generated by the IC integrated in the chip 115a. In particular, referring to the example considered and depicted in the drawings, a solution according to the prior art would involve transitions from the IC chip signal lines to the IC pads, to the C4 solder bumps 125, to the C4 pads 120 on the MCM's substrate 110, to the conductor lines 130 on the MCM's substrate, to the laser vias 135 (multiple such transitions may occur, in multi-layered MCM substrates), to the BGA bonding pads 140 of the MCM, to the BGA bumps 155, to the BGA pads 150 on the PCB 100, to the signal trace 160 on the PCB and, finally, to the terminals of the VCSEL 170.

According to an embodiment of the present invention, instead of conventionally propagating the high-speed electrical signals, from the signals' generator component, e.g. the IC pads 200a and 200b of the IC chip 115a, to the intended destination, e.g. the electro-optical converter 170, going from the signal generator's chip to the MCM, then to the PCB, and thus incurring all the transitions and physical discontinuities schematically listed above, the electric terminals of the signals' generator component are directly connected to corresponding electric terminals at the intended destination, e.g. electric terminals of the VCSEL 170, and for such a direct connection a small, flexible electrical interconnection member 190 (like a flexible flat cable) is exploited, bypassing the above-mentioned transitions and allowing to propagate the high-speed signals along a clean and short electrical path, possibly the shortest possible electrical path.

In other words, by using the flexible electrical interconnection member 190 to electrically connect, directly, the terminals of the signals' generator component 115a to the corresponding terminals of electro-optical converter 170, it is possible to avoid the necessity of designing a signal path passing through all the different hierarchies of packaging (chips, MCM, PCB).

In particular, according to an embodiment of the present invention, the flexible electrical interconnection member 190 is connected to the IC pads 200a and 200b through the C4 solder bumps 125a and 125b (FIG. 2); in other words, the IC pads 200a and 200b, instead of (or in addition to) being bonded, through C4 solder bumps, to C4 pads on the MCM substrate 110, are bonded to (respective conductor strips of) the flexible electrical interconnection member 190.

In alternative embodiments of the present invention, the flexible electrical interconnection member 190 may be bonded to contact pads on the MCM substrate, which pads are in turn connected, through conductor lines 130, e.g. on the upper MCM substrate surface, to, e.g., C4 contact pads 120 on the MCM substrate 110 to which the relevant pads of the IC are bonded, e.g. by conventional C4 bonding technique.

In the cited alternatives, the electrical signal path in the MCM substrate is minimal (particularly, under the viewpoint of the transitions and physical discontinuities that are detrimental to the propagation of the associated electromagnetic wave) or possibly even reduced to zero, in the case the flexible electrical interconnection member is bonded directly to the (C4 solder bumps attached to the) IC pads; in any case the PCB 100 may be not involved in the signal propagation, thus, thanks to the solution according to the described embodiment of the present invention, all the physical discontinuities associated with the transitions from the MCM to the PCB are eliminated. Additionally, the flexible electrical interconnection member 190 can be properly selected in such a way that its properties (particularly the properties of the materials it is made of), from the viewpoint of the impact on the propagation of the electromagnetic wave associated with the electrical signal, are significantly better than those of the MCM and PCB.

In FIGS. 3 and 4 a portion 300 of the flexible electrical interconnection member 190 is schematically depicted, in an embodiment of the present invention. In particular, the flexible electrical interconnection member portion 300 depicted in the drawings is the terminal portion thereof intended to be soldered to the (C4 bumps of the) IC pads of the IC chip 115a (in FIGS. 3 and 4 the flexible electrical interconnection member 190 is shown detached from the IC pads, for better clarity). A similar arrangement may be provided at the opposite end of the flexible electrical interconnection member (the end connected to the VCSEL 170). In particular, FIG. 3 is a top-plan view, whereas FIG. 4 is a sectional view of the flexible electrical interconnection member, taken along line IV-IV. The flexible electrical interconnection member 190 has, embedded therein, a number of conductor strips, like the four conductor strips 305-1, 305-2, 305-3 and 305-4 in the shown example. Referring to FIG. 4, the conductor strips 305-1, 305-2, 305-3 and 305-4 are for example made of a thin film of copper, and are immersed in an insulating material 310, like for example Benzo-Cyclo-Butene (BCB) or Liquid Crystal Polimers (LCP), polyesters (PET) like polyethyleneterephtalate, polyimides (PI) like the ones attained by the polycondensation polymer from 4,4'bis(aminophenyl)oxide and pyromellitic dianhydride (also called ODA-PMDA-based polyimide) commercially known under the name of Kapton™ by Du-pont, or polyperfluorocarbons like polytetrafluoroethylene (PTFE) also known as Teflon™, aramids; all the aforementioned materials can be used to produce composite materials with different fillers like ceramic, glass, or in association to adhesives, which are used to bond flexible substrates, including acrylics, epoxies, butyral-phenolics, polyesters, silicones, urethanes, fluorocarbons and blends of these materials. Similarly, recent developed materials have gained attention due to their good electrical perfromance like the Annylated-Poly-Phenylene-Ether (APPE).

Also, the flexible electrical interconnection member may be further covered with an additional dielectric/insulating layer, of materials that are flexible in nature and may present photoimageable characteristics. Basically, these materials are flexible solder masks and their utilization is aimed, wherever their chemical and physical characteristics allow, to reduce the overall application cost. They can be used to cover the flexible electrical interconnection member protecting its features in place of the more expensive base materials used in the core construction of the flexible circuit itself.

The conductor strips 305-1, 305-2, 305-3 and 305-4 have exposed terminations 315, not covered by the insulating material 310; the terminations 315 are in particular enlarged for facilitating the bonding to the C4 solder bumps of the IC chip pads. For example, the two conductor strips 305-2, 305-3 may be connected, at their enlarged terminations, to pads of the IC chip 115a at which a differential signal is made available for driving the VCSEL; the two conductor strips 305-1, 305-4 are for example connected to a reference voltage (e.g., the ground), for shielding purposes.

A possible assembling operations sequence may be the following.

The electro-optical converter 170 is firstly assembled as a stand-alone component, adopting conventional assembling techniques, and the component is tested.

In parallel to the assembling and testing of the electro-optical converter 170, the MCM 105 is assembled (e.g., the chips are attached to the MCM substrate 110), adopting conventional assembling techniques (e.g., C4 soldering of the chips to the MCM substrate). In the MCM assembly phase, one end of the flexible electrical interconnection member 190 is bonded either directly to the IC chip pads, through the C4 solder bumps, or to contact pads on the MCM substrate which are in turn connected to the proper IC pads. The assembled MCM is then tested.

Then, the assembled MCM, with a protruding pigtail of the flexible electrical interconnection member 190, is assembled to the PCB 100, and the PCB is tested (particularly, an in-circuit test is carried out).

The electro-optical converter 170 is then mounted to the PCB 100, and the flexible electrical interconnection member 190 is bonded to the electro-optical converter 170.

The complete PCB is then tested, particularly it is functionally verified.

An alternative sequence is the following.

The electro-optical converter 170 is firstly assembled as a stand-alone module, adopting conventional assembling techniques, and the component is tested. In the assembly phase, one end of the flexible electrical interconnection member 190 is bonded to the terminals of the electro-optical converter 170.

In parallel to the assembling and testing of the electro-optical converter 170, the MCM 105 is assembled (e.g., the chips are attached to the MCM substrate 110), adopting conventional assembling techniques (e.g., C4 soldering of the chips to the MCM substrate). The assembled MCM is then tested.

Then, the assembled MCM is assembled to the PCB 100, and the PCB is tested (particularly, an in-circuit test is carried out).

The electro-optical converter 170, with the flexible electrical interconnection member 190 attached thereto, is then mounted to the PCB 100, and the flexible electrical interconnection member 190 is bonded to the contact pads on the MCM substrate that are connected to the proper IC pads.

The complete PCB is then tested, particularly it is functionally verified.

In the invention embodiment up to now considered, a continuous flexible electrical interconnection member has been assumed to be used for connecting the IC to the electro-optical converter. This solution, albeit advantageous, may pose some problems in particular situations. For example, the assembling operations sequence of a part of the final electronic system may involve treatments in conditions that are not suitable for other parts of the system; for example, the electro-optical converter 170 may be not capable of sustaining the relatively high temperatures required for assembling the MCMs to the PCB. In such cases, it is not possible to complete the connection of the electronic components by the flexible electrical interconnection member until the critical operations are performed. This is the reason why, in the two assembling sequences described above, the MCM and the optical component were not connected to each other through the flexible electrical interconnection member before bonding the MCM to the PCB.

In particular, in the first assembling sequence described above, one end of the flexible electrical interconnection member was bonded to the IC pads at an earlier step, during the bonding of the chips to the MCM substrate; however, in doing so, a flexible electrical interconnection member pigtail remains attached to the MCM, until at the end of the assembling sequence the other end of the flexible electrical interconnection member is bonded to the electro-optical converter; handling pigtails may be burdensome. This problem is not present in the second assembling sequence described above, but in that case the electrical signal path that is finally obtained is not as good as in the former case, because there is a signal path portion on the MCM substrate (from the IC pads to the pads on the MCM substrate).

An alternative embodiment of the present invention that allows overcoming the drawbacks (encountered in those cases where it is not possible to preliminary interconnect the components to each other by the flexible electrical interconnection member and then attaching the components to the PCB) of having flexible electrical interconnection member pigtails to be handled, while fully exploiting the excellent properties of the flexible electrical interconnection member is depicted schematically in FIG. 2 and, in enlarged scale, in FIG. 5. The flexible connector 190 that directly connects the IC chip 125a to the electro-optical converter 170, is formed by two flexible electrical interconnection member spans 190a and 190b, one, namely the first span 190a, being attached to the IC chip 115a, and the other, second span 190b, being attached to the electro-optical converter 170. The two flexible electrical interconnection member spans 190a and 190b are mechanically and electrically joined together, at respective free ends 500a, 500b thereof. In particular, as schematically shown in FIG. 5, each conductor strip 305a, 305b in the first, respectively second electrical interconnection member span 190a, 190b terminates, in correspondence of the flexible electrical interconnection member span's end 500a, 500b, with an enlarged pad area 505a, 505b, having an exposed surface free of insulating material 310, and facilitating the operation of joining the two spans. Preferably, if the pitch of the conductor strips 305a, 305b is small, particularly of the order of the size of the enlarged pad areas, the enlarged pad area 505a, 505b of adjacent conductor strips are formed longitudinally displaced.

For mechanically and electrically attaching the flexible electrical interconnection member span 190b to the span 190a, small solder bumps 510, particularly micrometric, generically spherical or semi-spherical bumps like micro BGA solder bumps are provided, e.g. on the enlarged pad areas 505a. Then, during the assembling, the two flexible electrical interconnection member spans are put close to each other, particularly the free end portion of the second span 190b is positioned so as to surmount the free end portion of the first span 190a, having care to carefully align the enlarged pad areas 505a and 505b. The solder bumps 510 are then caused to reflow, by applying a suitable heat and pressure, for example using a thermode or a laser soldering technique, thus firmly joining electrically and mechanically the two flexible electrical interconnection member spans 190a and 190b.

A possible assembling operations sequence may in this case be the following.

The electro-optical converter 170 is firstly assembled as a stand-alone module, adopting conventional assembling techniques, and the component is tested. In the assembly phase, one end of the second span 190b of the flexible electrical interconnection member 190 is bonded to the terminals of the electro-optical converter 170, leaving the opposite end (the end denoted 500b in FIG. 2) free.

In parallel to the assembling and testing of the electro-optical converter 170, the MCM 105 is assembled, and in particular the chips 115a and 115b are attached to the MCM substrate 110, adopting conventional assembling techniques (e.g., C4 soldering of the chips to the MCM substrate). In this assembly phase, one end of the first span 190a of the flexible electrical interconnection member 190 is bonded directly to the IC chip pads, through the C4 solder bumps 125a, 125b. Expediently, the first span 190a of the flexible electrical interconnection member 190 extends just to the edge of the MCM substrate 110, without substantially protruding therefrom, so that the MCM 105, once assembled, does not exhibit pigtails. The assembled MCM 105 is then tested. The flexible electrical interconnection member span 190a may also be anchored to the MCM substrate 110.

Then, the assembled MCM is assembled to the PCB 100, and the PCB is tested (particularly, an in-circuit test is carried out).

The electro-optical converter 170, with the attached flexible electrical interconnection member span 190b is then mounted to the PCB 100. The end 500b of the flexible electrical interconnection member span 190b attached to the electro-optical converter 170 is then bonded to the end 500a of the flexible electrical interconnection member span 190a on the MCM 105. The small, micro BGA solder bumps 510 are provided on the enlarged pad areas 505a of the flexible connector span 190a, for example by preplating the parts with the selected solder or conductive glue media; these media can be applied by different methods, like for example electrolytic or electroless metal plating, paste screening, molten solder injection or dispense, sputtering and so on. Then, the free end portion of the second span 190b is positioned so as to surmount the free end portion of the first span 190a, having care to align the enlarged pad areas 505a and 505b. The solder bumps 510 are then caused to reflow, by applying a suitable combination of heat and pressure, for example using a thermode or a laser soldering technique, thus firmly joining electrically and mechanically the two flexible connector spans.

The complete PCB is then tested, particularly it is functionally verified.

The Applicant has observed that despite the presence of the joint joining the two flexible electrical interconnection member spans 190a and 190b, the signal propagation properties of this solution are nevertheless better than those achievable in the case even a part of the signal propagation path is on the MCM substrate, not to say on the PCB. The physical discontinuity created by the joint between the two flexible electrical interconnection member spans, being the joint miniaturized, is of minimal impact on the signal propagation, particularly the impedance mismatch is low.

Figure 6:
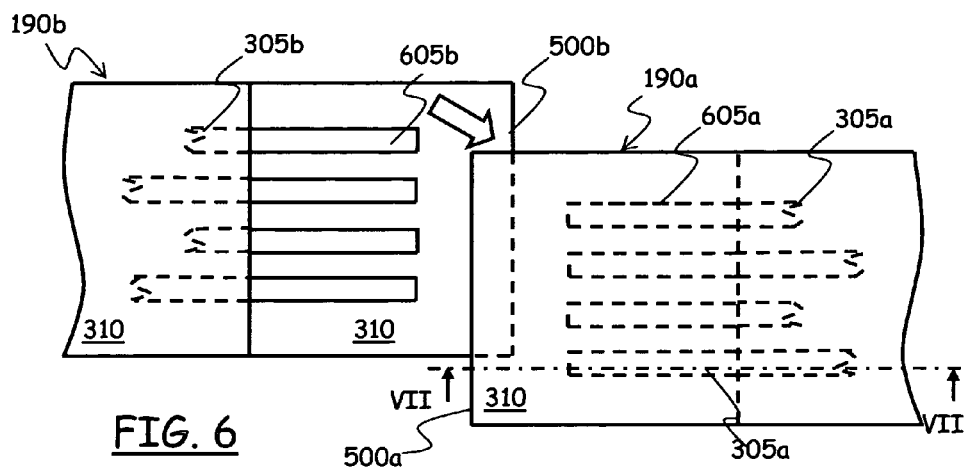
FIGS. 6 and 7 schematically show, in top-plan and cross-sectional views, respectively, two ends of two spans of a flexible electrical interconnection member intended to be joined to each other, according to an alternative embodiment of the present invention.
Figure 7:
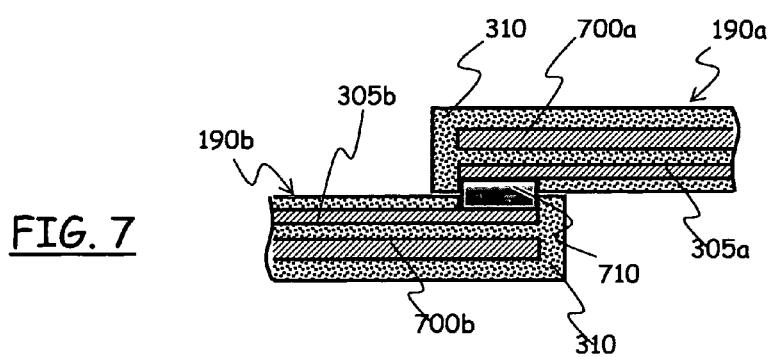

Under the point of view of minimizing the impact of the physical discontinuity created by the flexible electrical interconnection member spans joint, an improvement to the use of the micro spherical or semi-spherical solder bumps is described in the following, making reference to FIGS. 6 and 7.

Each of the two flexible electrical interconnection member spans 190a and 190b has, in correspondence of the free end 505a and 505b thereof, a portion in which the conductor strips 305a and 305b are not covered by the dielectric material 310. No enlarged pad areas are provided, differently from the embodiment of FIGS. 3 to 5. In particular, albeit this not a to be intended as a limitation to the present invention, the flexible electrical interconnection member spans 190a and 190b include a conductive material layer 700a and 700b, adapted for example to be connected to a reference voltage (ground), and acting as a reference voltage (ground) plane.

During the manufacturing of the flexible electrical interconnection member spans, a small, controlled amount of solder alloy (whose composition can be of type known in the art) is provided on the exposed surface portion of the conductor strips 305a or 305b of either one of the two flexible electrical interconnection member spans 190a, 190b, for example the span 190a. In particular, the amount of solder may be controlled by exploiting a self-limiting solder transfer process, self limited by the solder's surface tension, or by wetting.

In the electronic system assembling phase, the two ends 505a and 505b of the flexible electrical interconnection member spans 190a and 190b are aligned and stacked one onto the other, in such a way that the exposed portions of the conductor strips 305a and 305b are properly aligned and superimposed one to the other. A suitable combination of pressure and temperature is then locally applied to the stacked ends of the flexible electrical interconnection member spans, for example using a flat thermode, so as to cause the solder alloy present on the exposed surface of the conductors of one of the two spans to reflow and wet the exposed surface of the conductor strips of the other span. The heating is merely local, and does not compromise any of the electronic components already assembled to the PCB; thus, this operation can safely be performed at the end of the assembling process, or even in the field, after the components have been assembled/replaced to the PCB. If desired, the flexible electrical interconnection member span 190b may be anchored to the MCM substrate 110, e.g. along the edge thereof; however, it is observed that the flexible electrical interconnection member 190 and the joint between its two spans 190a and 190b is not expected to be exposed to significant mechanical stresses that can lead to fatigue failure of the joint. Furthermore, the degree of free movement allowed by the fact that the connection made by the electrical interconnection member is flexible allows to compensate a much larger assembly/fabrication range of cumulative tolerance. It is also to be underlined that the optical device 170 connected with the flexible electrical interconnection member 190 can be spatially placed in a three-dimensional position in respect of referenced position of the electronics module and PCB card.

In this way, a very thin soldering 710 is achieved (through essentially flat solder pads), of height substantially equal to (twice) the thickness of the dielectric 310. This allows reducing the impact of the discontinuity inherent to the joint of the two flexible conductor spans, and in particular to reduce the impedance mismatch.

Figure 8:
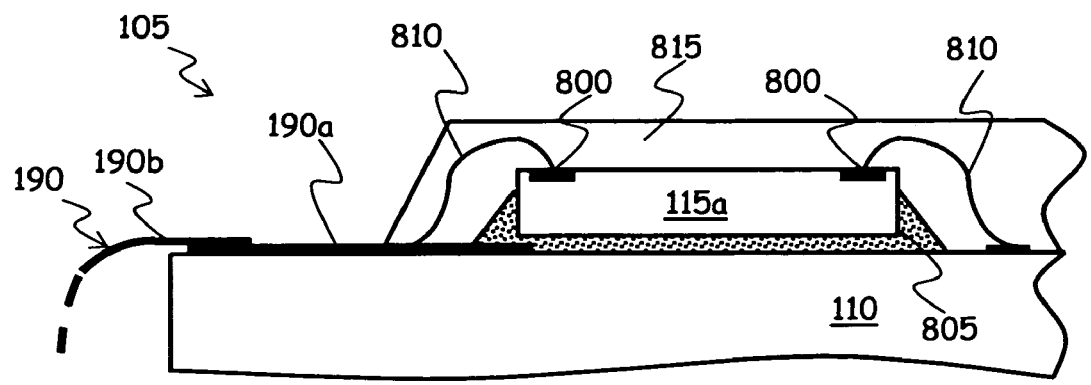
FIG. 8 is a view similar to that of FIG. 2, but showing a further embodiment of the present invention.
Figure 9:
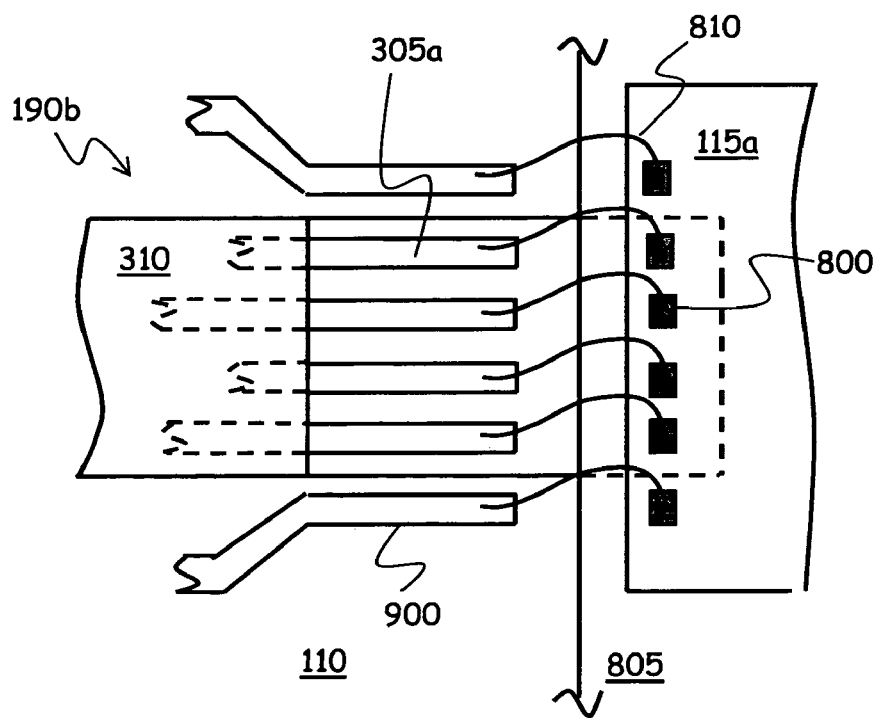
FIG. 9 is a simplified, schematic top-plan view of the embodiment of FIG. 8.

FIGS. 8 and 9 show a still further alternative embodiment of the present invention, wherein the flexible electrical interconnection member 190, particularly the first span 190a thereof, as in one of the embodiments previously discussed, is connected to the relevant pads of the IC chip through conventional wire-bond techniques. In particular, as schematized in the drawings, the IC chip 115a, instead of being attached to the MCM substrate 110 by means of the C4 technique (with the IC chip turned upside-down, so that the IC bonding pads directly faces the corresponding pads on the MCM substrate) is attached to the MCM substrate 110 by the bottom surface (i.e., the surface opposite to that on which the IC pads 800 lay), for example by gluing or other attachment methodology; in the drawings, reference numeral 805 denotes a glue that maintains the IC chip 115a attached to the MCM substrate 110. The IC chip pads 800 are wire-bonded, by means of tiny bonding wires 810, either to bonding pads/conductive strips 900 provided on the surface of the MCM substrate 110, or to the conductor strips 305a, at exposed portions thereof provided at the end of the first span of the flexible electrical interconnection member span 190a. Preferably, the terminal portion of the flexible electrical interconnection member span 190a is placed and anchored into the required position by exploiting the same glue 805 that holds the IC chip 115a in place; in this way, the flexible electrical interconnection member span 190a becomes an integral part of a device bonding pattern present on the surface of the MCM. A layer 815 of suitable protecting agents, know as molding or globtop materials, covers the IC chip 115a and the bonding wires 810, protecting them; in this way, the flexible electrical interconnection member span 190a becomes integral part of the electronic module. It is observed that the wire-bond solution can as well be adopted in case a continuous, single-span electrical interconnection member 190 is exploited.

Thanks to the present invention, herein disclosed making reference to some, merely exemplary and non limitative embodiments thereof, it is possible to create a propagation path, particularly adapted to sustain the propagation of a high-speed electrical signal, from a signal source location to a signal destination location within an electronic system, avoiding most, not to say all the discontinuities usually encountered in signal propagation paths obtained through conventional techniques.

It is observed that although in the preceding description reference has been made to the propagation of an electrical signal from, e.g., a signal generator integrated in a chip mounted to an MCM, to an electro-optical converter, this is not to be intended as a limitation of the present invention, which applies in general to the propagation of an electrical signal between two points whatsoever in an electronic system. In particular, and just by way of example, the invention applies as well to the propagation of an electric signal generated by an opto-electrical converter, like a photodetector mounted to the PCB, to a signal processor integrated in a chip of an MCM, or from an electronic component directly mounted to the PCB to an IC integrated in a chip of an MCM, or vice versa, or also from an electronic component embedded in a chip of one MCM of attached to the PCB to an electronic component embedded in a chip of another MCM attached to the PCB.

It is also pointed out that although in the foregoing reference has always been made to a multi-chip module, this is not to be construed as a limitation of the present invention, which finds more general applicability, for example in cases wherein a single-chip module, with a single IC chip like the chip 115*a* assembled to a substrate like the MCM substrate 110, which is then assembled to the PCB 100.

The invention claimed is:

1. An electronic system comprising:
    an electronic system support substrate for the attachment of components of the electronic system, said electronic system support substrate including electric signal propagation paths for the propagation of electric signals between the system components;
    at least a first and a second electronic components, wherein at least the first electronic component is a signal generator component internal part of a module in mechanical and electrical connection with the electronic system support substrate, said module comprising a module substrate to which the first electronic component is at least mechanically connected, and
    an electric coupling between the first and the second electronic component external to said module, the electric coupling allowing the first and the second electronic component exchange electric signals,
    characterized in that said electric coupling comprises a direct electric connection over a flexible electrical interconnection flat cable member between the first and the second electronic components to directly connect the terminals of the signal generator component internal part of the module to corresponding terminals of said second electronic component external to said module bypassing transitions of any printed circuit board which is part of said electronic system, said direct electric connection being independent of the electronic system support substrate.

2. The electronic system according to claim 1, in which said electric connection includes a flexible electrical interconnection member having a first end electrically connected to the first electronic component, and a second end electrically connected to the second electronic component.

3. The electronic system according to claim 2, in which the flexible electrical interconnection member includes at least one flexible conductor strip, particularly of copper, embedded in an insulating material.

4. The electronic system according to claim 3, in which said insulating material include a material selected from the group including benzo-cyclo-butene, liquid-crystal-polymer, polyesters, particularly polyethyleneterephtalate, polyimides, polyperfluorocarbons, particularly polytetrafluoroethylene, aramids.

5. The electronic system according to claim 3, in which said first electronic component includes an integrated circuit chip having a contact pad, said first end of the flexible electrical interconnection member being connected to said contact pad by soldering.

6. The electronic system according to claim 3, in which said first electronic component includes an integrated circuit chip having a contact pad, said contact pad being connected to a conductor strip of the module substrate, wherein said first end of the flexible electrical interconnection member electrically connected to the first electronic component is soldered to said conductor strip.

7. The electronic system according to claim 3, in which said first electronic component includes an integrated circuit chip having a contact pad, said first end of the flexible electrical interconnection member being connected to said contact pad by means of at least one bonding wire.

8. The electronic system according claim 1 of the preceding claims, in which said electric connection includes at least a first span, having a first end coinciding with a first end of the electric connection and a second end, and a second span, having a first end coinciding with the second end of said electric connection and a second end, said first and second spans being mechanically and electrically joined one to the other at their second ends.

9. The electronic system according to claim 8, in which said first and second spans are mechanically and electrically joined one to the other at their second ends by soldering.

10. The electronic system according to claim 9, in which said first and second spans are mechanically and electrically joined one to the other at their second ends by ball soldering, particularly micro spheres soldering.

11. The electronic system according to claim 9, in which said first and second spans are mechanically and electrically joined one to the other at their second ends by means of flat pad soldering.

12. The electronic system according to claim 9, in which said first and second spans are mechanically and electrically joined one to the other at their second ends by means of electrically conductive glue.

13. The electronic system according to claim 1 of the preceding claims, in which one among the first and second electronic components includes an electro-optical or opto-electrical conversion element.

14. The electronic system according to claim 1 of the preceding claims, in which said module includes a multi-component module, particularly a multi-chip module.

* * * * *